(12) United States Patent
Sun et al.

(10) Patent No.: US 11,404,399 B2
(45) Date of Patent: Aug. 2, 2022

(54) CHIP TRANSFER SUBSTRATE, CHIP TRANSFER DEVICE AND CHIP TRANSFER METHOD

(71) Applicants: BEIJING BOE DISPLAY TECHNOLOGY CO., LTD., Beijing (CN); BOE TECHNOLOGY GROUP CO., LTD., Beijing (CN)

(72) Inventors: Hanyan Sun, Beijing (CN); Dongqi Liu, Beijing (CN); Hui Zheng, Beijing (CN); Xiaojian Yang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 122 days.

(21) Appl. No.: 16/911,210

(22) Filed: Jun. 24, 2020

(65) Prior Publication Data
US 2021/0020615 A1    Jan. 21, 2021

(30) Foreign Application Priority Data

Jul. 18, 2019 (CN) .......................... 201910651165.8

(51) Int. Cl.
*H01L 25/075*    (2006.01)
*H01L 21/683*    (2006.01)

(52) U.S. Cl.
CPC ...... *H01L 25/0753* (2013.01); *H01L 21/6833* (2013.01); *H01L 21/6835* (2013.01)

(58) Field of Classification Search
CPC ............ H01L 25/0753; H01L 21/6833; H01L 21/6835; H01L 21/67138; H01L 24/95; H01L 2221/68322; H01L 2221/68354; H01L 2221/68363; H01L 2221/68381; H01L 27/156
(Continued)

(56) References Cited

U.S. PATENT DOCUMENTS 8,399,876 B2 * 3/2013 Kim .................. H01L 33/24
                                                257/13
9,287,445 B2 * 3/2016 Yoo .................. H01L 33/387
(Continued)

FOREIGN PATENT DOCUMENTS

CN       206921844 U    1/2018
CN       107888556 A    4/2018
(Continued)

OTHER PUBLICATIONS

First Office Action dated Dec. 29, 2020 for application No. CN201910651165.8 with English translation attached.

*Primary Examiner* — Vu A Vu
(74) *Attorney, Agent, or Firm* — Nath, Goldberg & Meyer; Joshua B. Goldberg (57) ABSTRACT

The present disclosure provides a chip transfer substrate, a chip transfer device and a chip transfer method. The chip transfer substrate includes a substrate, a plurality of bases spaced apart from each other on the substrate, the plurality of bases being configured to carry micro light emitting diodes (Micro LEDs) to be transferred and being movable on the substrate; and a plurality of distance adjusting components each arranged between two adjacent bases and configured to adjust a distance between the two adjacent bases.

17 Claims, 4 Drawing Sheets

(58) Field of Classification Search
USPC .......................................................... 438/28
See application file for complete search history.

(56) References Cited

U.S. PATENT DOCUMENTS

| | | | | |
|---|---|---|---|---|
| 9,478,583 | B2* | 10/2016 | Hu | ........................ H01L 33/62 |
| 9,608,163 | B2* | 3/2017 | Cha | ........................ H01L 33/24 |
| 10,002,856 | B1* | 6/2018 | Bedell | ................. H01L 21/6836 |
| 10,578,789 | B2* | 3/2020 | Ngai | ................... G02B 6/0021 |
| 10,837,624 | B2* | 11/2020 | Gladden | .............. G02B 6/0036 |
| 2003/0006416 | A1 | 1/2003 | Dudoff et al. | |
| 2008/0194059 | A1 | 8/2008 | Wang et al. | |
| 2014/0159064 | A1* | 6/2014 | Sakariya | ................. H01L 33/60 |
| | | | | 257/88 |
| 2018/0102352 | A1* | 4/2018 | Sasaki | ................... H01L 33/007 |
| 2019/0027639 | A1* | 1/2019 | Yoon | ..................... H01L 33/005 |
| 2020/0140989 | A1* | 5/2020 | Kim | ........................ C23C 14/24 |
| 2020/0219855 | A1* | 7/2020 | Chen | ..................... H01L 33/483 |
| 2021/0134641 | A1* | 5/2021 | Fiorenza | ................. H01L 23/36 |

FOREIGN PATENT DOCUMENTS

| | | |
|---|---|---|
| CN | 109273387 A | 1/2019 |
| CN | 109411392 A | 3/2019 |
| CN | 109449100 A | 3/2019 |
| CN | 109524339 A | 3/2019 |
| CN | 109599354 A | 4/2019 |
| CN | 109920754 A | 6/2019 |
| JP | 2019062101 A | 4/2019 |

\* cited by examiner

CHIP TRANSFER SUBSTRATE, CHIP TRANSFER DEVICE AND CHIP TRANSFER METHOD

CROSS REFERENCE TO RELATED APPLICATION

This application claims priority to Chinese patent application No. 201910651165.8, filed on Jul. 18, 2019, the entire contents of which are incorporated herein by reference.

TECHNICAL FIELD

The present disclosure relates to the field of display technology, and particularly relates to a chip transfer substrate, a chip transfer device and a chip transfer method.

BACKGROUND

The micro light emitting diode (Micro LED) display technology is a display technology in which a conventional display device is miniaturized and matrixed, and a driving circuit is manufactured by an integrated circuit process, so as to implement address control and individual driving of each pixel. Because various indexes of the Micro LED display technology such as brightness, service life, contrast, reaction time, energy consumption, visual angle, resolution and the like are superior to those of the traditional display technology, and the Micro LED display technology has advantages of self-luminescence, simple structure, small volume and energy efficiency, it is considered as the next generation display technology.

SUMMARY

In one aspect, the present disclosure provides a chip transfer substrate, including:

a substrate;

a plurality of bases spaced apart from each other on the substrate, the plurality of bases being configured to carry micro light emitting diodes (Micro LEDs) to be transferred and being movable on the substrate; and a plurality of distance adjusting components each arranged between two adjacent-bases and configured to adjust a distance between the two adjacent bases.

In an embodiment, each of the plurality of distance adjusting components includes a first electrification structure and a second electrification structure opposite to each other;

between two adjacent bases, one end of the first electrification structure is connected to one end of the second electrification structure and to one base, the other end of the first electrification structure is connected to the other end of the second electrification structure and to the other base, and the first and second electrification structures are deformed and brought into contact with each other by an external force, and surfaces of the first and second electrification structures facing each other generate charges of opposite polarities when brought into contact with each other.

In an embodiment, the first electrification structure includes a first electrode and a first thin film layer on a side of the first electrode close to the second electrification structure;

the second electrification structure includes a second electrode opposite to the first electrode and a second thin film layer on a side of the second electrode close to the first electrification structure; and the first thin film layer and the second thin film layer have different dielectric constants from each other.

In an embodiment, a transfer electrode is on each of the plurality of bases; and the transfer electrode is electrically connected to the first electrode.

In an embodiment, the transfer electrode has the same material as the first electrode, and the transfer electrode and the first electrode are formed as a single piece.

In an embodiment, a material of the transfer electrode includes copper.

In an embodiment, a material of the first thin film layer includes polyimide; and a material of the second thin film layer includes polyethylene terephthalate.

In an embodiment, the plurality of bases are in one-to-one correspondence with the Micro-LEDs to be transferred.

In an embodiment, the plurality of distance adjusting components each have a diamond shape or an oval shape when viewed in a side view.

In an embodiment, the plurality of bases are arranged in a matrix when viewed in a plan view.

In another aspect, the present disclosure further provides a chip transfer device including the chip transfer substrate according to the embodiments of the present disclosure.

In an embodiment, the chip transfer device further includes a driving component connected to each of the distance adjusting components and configured to apply an external force to the distance adjusting component to adjust the distance between two adjacent bases.

In an embodiment, the driving component is configured to:

apply an external force in a vertical direction to the distance adjusting component to enable the distance adjusting component to be in an extending state in which a first distance is present between two adjacent bases; and apply an external force in a horizontal direction to the distance adjusting component to enable the distance adjusting component to be in a contraction state in which a second distance is present between two adjacent bases, the second distance being smaller than the first distance.

In an embodiment, the chip transfer device further includes a receiving substrate including a receiving base and a receiving electrode on a side of the receiving base close to the chip transfer substrate.

In an embodiment, the chip transfer device further includes a receiving substrate including a receiving base and a receiving electrode on a side of the receiving base close to the chip transfer substrate, wherein the receiving electrode is configured to contact the distance adjusting component in response to the distance adjusting component being in the contraction state.

In another aspect, the present disclosure further provides a chip transfer method using a chip transfer device, wherein the chip transfer device is the chip transfer device according to the embodiments of the present disclosure.

In an embodiment, the chip transfer method includes:

applying an external force in a vertical direction to the distance adjusting component to enable the distance adjusting component to be in an extending state in which a first distance is present between two adjacent bases;

depositing the Micro LEDs to be transferred on the bases;

applying an external force in a horizontal direction to the distance adjusting component to enable the distance adjusting component to be in a contraction state in which a second distance is present between two adjacent bases, the second distance being smaller than the first distance; and transferring the Micro LEDs to a receiving substrate.

DETAILED DESCRIPTION

In order that those skilled in the art will better understand the technical solutions of the present disclosure, the following detailed description will be given with reference to the accompanying drawings and the specific embodiments.

At present, in the process of manufacturing a Micro LED display panel, Micro LEDs are formed on a transfer substrate at first, and then massive Micro LEDs are transferred to a receiving substrate, so that the massive transfer of the Micro LEDs is realized.

The general precision of the conventional massive transfer of the Micro LEDs is not high, the distance between the Micro LEDs is relatively large, and the requirement of high precision of the massive transfer cannot be met.

Figure 1A:
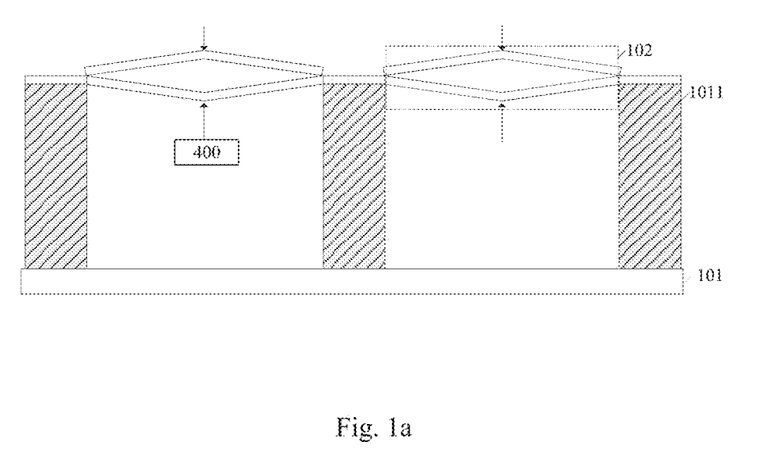
FIG. 1a, FIG. 1b, FIG. 3a and FIG. 3b are schematic side views of a structure of a chip transfer substrate according to an embodiment of the disclosure.
Figure 1B:
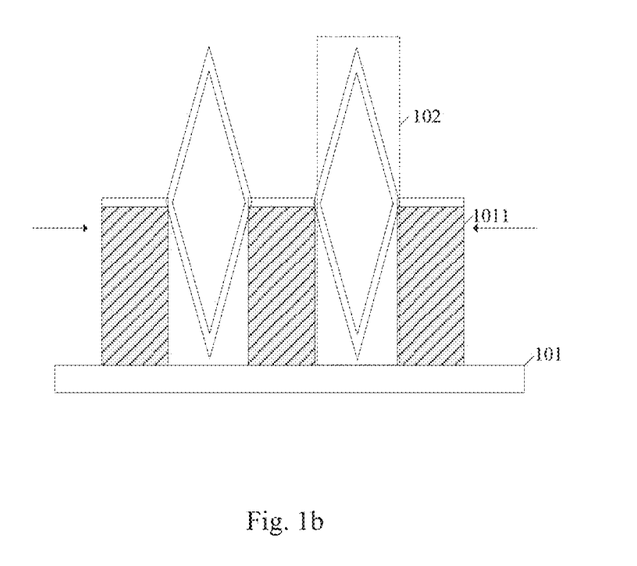

An embodiment of the present disclosure provides a chip transfer substrate, which can be used for transferring massive chips. In an embodiment, the chip transfer substrate can be used for massive transfer of Micro LEDs in the manufacturing process of a Micro LED display panel. FIG. 1a and FIG. 1b are schematic side views of a structure of a chip transfer substrate according to an embodiment of the disclosure. As shown in FIGS. 1a and 1b, a chip transfer substrate according to an embodiment of the present disclosure includes a substrate 101 and a plurality of distance adjusting components 102. A plurality of bases 1011 spaced apart from each other are arranged on the substrate 101. The bases 1011 are configured to carry the Micro LEDs to be transferred and are movable on the substrate 101. Each of the distance adjusting components 102 is between two adjacent bases 1011 and is configured to adjust a distance between the two adjacent bases 1011.

Figure 2A:
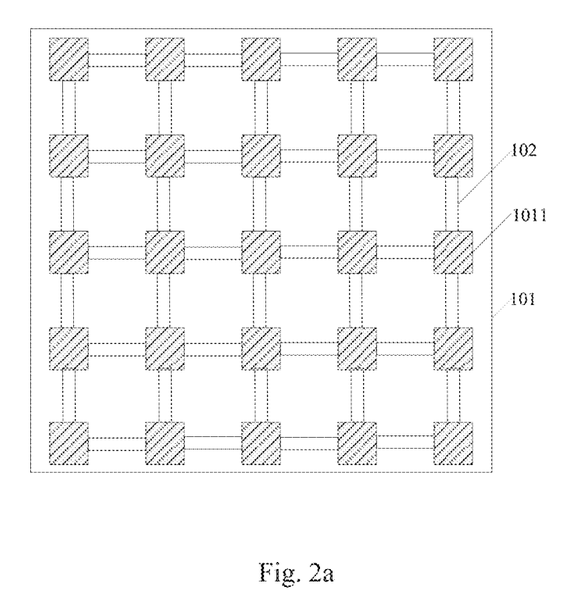
FIG. 2a and FIG. 2b are schematic top views of a structure of a chip transfer substrate according to an embodiment of the disclosure.
Figure 2B:
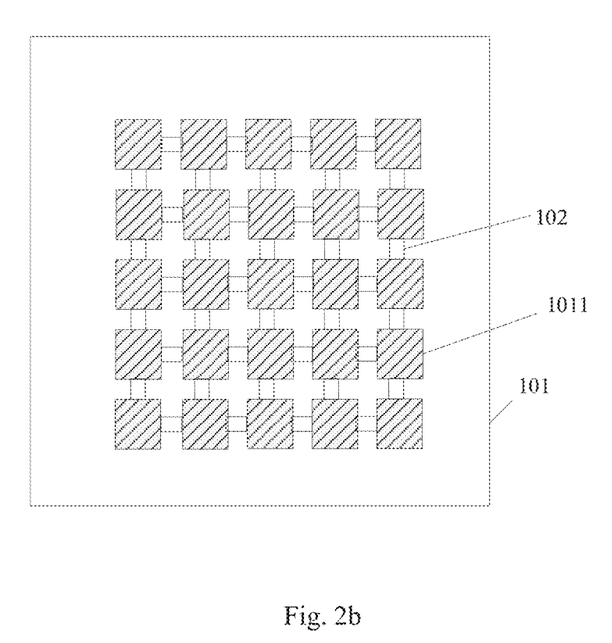

In the chip transfer substrate according to the present disclosure, in an initial state, the distance adjusting component 102 disposed between two bases 1011 is made in an extending state by applying an external force thereto, such that a distance between two adjacent bases 1011 reaches a maximum distance. In practical applications, the maximum distance between two adjacent bases 1011 can be the distance that can be achieved between two adjacent Micro LEDs to be transferred in the prior art. Then, through a deposition process, Micro LEDs are deposited on the bases 1011 of the substrate 101, so as to form massive Micro LEDs arranged in a matrix (i.e., a Micro LED array). After the Micro LED array is manufactured, the distance adjusting component 102 disposed between the two bases 1011 is made in a contraction state by applying an external force thereto, and in the contraction state, the distance between the two adjacent bases 1011 is shortened to a minimum, so that the distance between the Micro LEDs on the bases 1011 is shortened. Finally, the Micro LEDs to be transferred on the bases 1011 are transferred. FIG. 2a and FIG. 2b are schematic top views of a structure of a chip transfer substrate according to an embodiment of the disclosure. As can be seen from FIG. 2a and FIG. 2b, in the chip transfer substrate according to the embodiment of the present disclosure, the distance between adjacent bases 1011 can be shortened by the distance adjusting component 102, so as to shorten the distance between the Micro LEDs to be transferred, thereby improving the accuracy of massive transfer of Micro LEDs and realizing high accuracy of massive transfer of the Micro LEDs. Moreover, when the Micro LEDs are deposited to form the Micro LED array, the distance adjusting component 102 is in the extending state, so that the distance between the Micro LEDs is large, the requirement on processing accuracy is low, the manufacturing difficulty of the Micro LED array can be reduced, and the manufacturing cost can be saved.

Figure 3A:
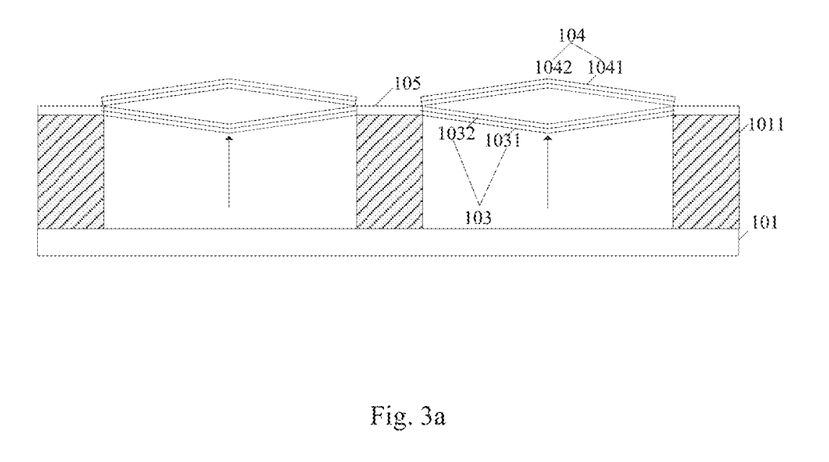
Figure 3B:
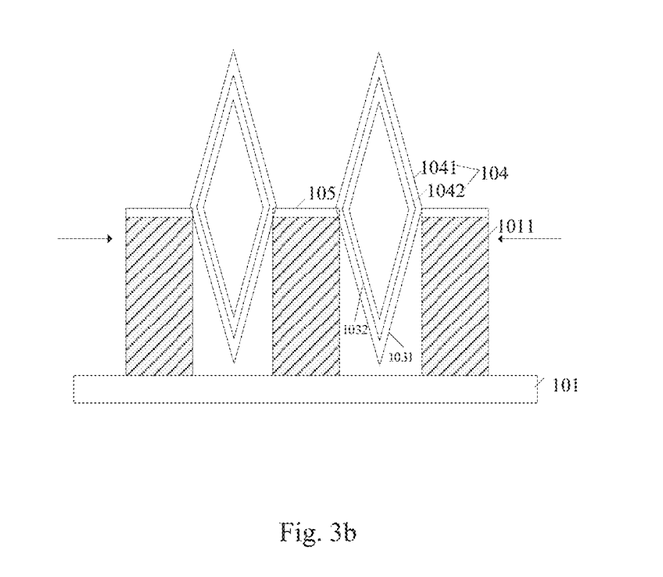

In one example, as shown in FIGS. 3a and 3b, the distance adjusting component 102 may include: a first electrification structure 103 and a second electrification structure 104 opposite to each other. Between two adjacent bases 1011, one end of the first electrification structure 103 is connected to one end of the second electrification structure 104 and to one base 1011, and the other end of the first electrification structure 103 is connected to the other end of the second electrification structure 104 and to the other base 1011. In an embodiment, the first and second electrification structures 103 and 104 are flexible structures. The first and second electrification structures 103 and 104 are deformed due to an external force in the vertical direction applied thereto and can generate charges of opposite polarities when brought into contact with each other.

In an embodiment, the distance adjusting component 102 has a diamond shape or an oval shape when viewed in a side view.

It should be noted that, in the embodiment of the present disclosure, the distance adjusting component 102 is composed of a first electrification structure 103 and a second electrification structure 104 opposite to each other. In the initial state, an external force is applied to the first and second electrification structures 103 and 104 so that the first and second electrification structures 103 and 104 may be in the extending state along a direction parallel to the plane of the substrate 101 and may be in contact with each other, and a direction of the external force may be perpendicular to the plane of the substrate 101 (i.e., a vertical direction). The first and second electrification structures 103 and 104 can be repeatedly extended and contracted, and charges of equal amount and opposite polarities can be generated on the surfaces of the first and second electrification structures 103 and 104 that are in contact with each other due to the triboelectric effect. At this time, since the first and second electrification structures 103 and 104 have a certain gap therebetween, which is smaller than a predetermined critical value, the first and second electrification structures 103 and 104 are in a balanced state, so that charges can be shielded between the first and second electrification structures 103 and 104, and cannot be conducted outward or neutralized. The first and second electrification structures 103 and 104 may be separated from each other to a certain extent depending on the precision of the Micro LEDs on the Micro LED display panel by applying an external force, and this state may be referred to as the contraction state of the distance adjusting component 102. As the distance between the surfaces of the first and second electrification structures 103 and 104 opposite to each other increases, the distance between the adjacent bases 1011 shortens, thereby shortening the distance between the adjacent Micro LEDs to be transferred. At this time, the first and second electrification structures 103 and 104 are in a separated state, the gap between the first and second electrification structures 103 and 104 is large and larger than the predetermined critical value, the balanced state of the first and second electrification structures 103 and 104 is broken, and thus a potential difference is generated between the first and second electrification structures 103 and 104.

In an embodiment, as shown in FIGS. 3a and 3b, the first electrification structure 103 includes a first electrode 1031, and a first thin film layer 1032 on the first electrode 1031. The second electrification structure 104 includes a second electrode 1041 opposite to the first electrode 1031 and a second thin film layer 1042 on a side of the second electrode 1041 close to the first electrode 1031. In an embodiment, the first thin film layer 1032 and the second thin film layer 1042 face each other, and the first thin film layer 1032 and the second thin film layer 1042 are made of insulating materials having different dielectric constants.

The first thin film layer 1032 and the second thin film layer 1042 are made of two kinds of insulating materials having different dielectric constants. In the initial state, the first thin film layer 1032 and the second thin film layer 1042 may be repeatedly extended and contracted, and charges of equal amount and opposite polarities may be generated on the surfaces of the first thin film layer 1032 and the second thin film layer 1042 due to the triboelectric effect. At this time, the gap between the first thin film layer 1032 and the second thin film layer 1042 is small and smaller than the predetermined critical value, and a dipole layer is formed at the interface of the first thin film layer 1032 and the second thin film layer 1042. Since the first thin film layer 1032 and the second thin film layer 1042 are both made of insulating materials, charges of opposite polarities shield each other at the interface, and the generated charges do not be conducted or neutralized and are in a balanced state. Then, by applying an external force in the horizontal direction (i.e., a direction perpendicular to the vertical direction), the first thin film layer 1032 and the second thin film layer 1042 are separated. Since the first thin film layer 1032 and the second thin film layer 1042 are in the separated state, a gap between the first thin film layer 1032 and the second thin film layer 1042 is large and larger than the predetermined critical value, charges with opposite polarities on the two thin film layers cannot be completely shielded, and a potential difference is generated. At this time, charges with an opposite polarity to the polarity of the charges generated by the first thin film layer 1032 are induced from the first electrode 1031, and charges with an opposite polarity to the polarity of the charges generated by the second thin film layer 1042 are induced from the second electrode 1041, so that the polarities of the charges on the first electrode 1031 and the second electrode 1041 are also opposite to each other. Since the first electrode 1031 is a conductor, the induced charges with corresponding polarity can be conducted to the base 1011 (described later), and the Micro LEDs can be fixed and then massively transferred by utilizing the adsorption capability of static electricity to the Micro LEDs. It is understood that the first electrode 1031 and the second electrode 1042 make the thin film layers thereon contact with or separated from each other when being subjected to an external force, and the structures of the first electrode 1031 and the second electrode 1042 can be bent structures as shown in FIGS. 3a and 3b, circular arc structures or structures having other shapes, which are not listed here.

In an embodiment, a transfer electrode 105 is disposed on each base 1011, and the transfer electrode 105 is electrically connected to the first electrode 1031.

It should be noted that, since the transfer electrode 105 is electrically connected to the first electrode 1031, the charges with the corresponding polarity induced from the first electrode 1031 can be conducted to the transfer electrode 105 on the base 1011, so that the charges on the transfer electrode 105 and the charges on the first electrode 1031 have the same polarity. Also, the transfer electrode 105 and the first electrode 1031 may be made of the same material, which facilitates the conduction of charges from the first electrode 1031 to the transfer electrode 105. When the transfer electrode 105 is charged, the charges in the Micro LED to be transferred on the transfer electrode 105 can be excited to move in the vertical direction, so that the charges at the lower side of the Micro LED to be transferred have an opposite polarity to the charges of the transfer electrode 105, and therefore the transfer electrode 105 can adsorb the Micro LED to be transferred. Therefore, the Micro LED is fixed, and the massive transfer of Micro LEDs can be realized.

In an embodiment, the transfer electrode 105 and the first electrode 1031 are formed as a single piece.

It should be noted that the material of the transfer electrode 105 is the same as that of the first electrode 1031, and the transfer electrode 105 and the first electrode 1031 are formed as a single piece, which facilitates manufacturing the electrodes and can reduce the process difficulty.

In an embodiment, the material of the transfer electrode 105 includes copper.

It should be noted that the transfer electrode 105 may be made of copper, or may be made of other materials that are favorable for conducting charges, which are not listed here.

In an embodiment, the material of the first thin film layer 1032 includes polyimide; and the material of the second thin film layer 1042 includes polyethylene terephthalate.

It should be noted that the first thin film layer 1032 is made of polyimide, the second thin film layer 1042 is made of polyethylene terephthalate, and the dielectric constant of polyimide is smaller than that of polyethylene terephthalate. According to the triboelectric series and the kohn's law, the material having a larger dielectric constant is positively charged and the material having a smaller dielectric constant is negatively charged, so that when the first thin film layer 1032 and the second thin film layer 1042 contact each other, the first thin film layer 1032 can generate negative charges, the second thin film layer 1042 can generate positive charges with the same amount (as shown in the upper part in FIG. 4). The first thin film layer 1032 and the second thin film layer 1042 shield each other, and induce the first electrode 1031 to generate positive charges, and the second electrode 1041 to generate negative charges. When the first thin film layer 1032 and the second thin film layer 1042 are separated from each other, the shielding effect between the first thin film layer 1032 and the second thin film layer 1042 is eliminated, and charges can be conducted to the corresponding positions through the first electrode 1031 and the second electrode 1041, for the massive transfer of Micro LEDs.

In an embodiment, the bases 1011 are in one-to-one correspondence with the Micro LEDs to be transferred.

It should be noted that each base 1011 can be used to carry one Micro LED, and bases having the same number as the Micro LEDs to be transferred can be provided, so as to realize the massive transfer of the Micro LEDs.

Figure 4:
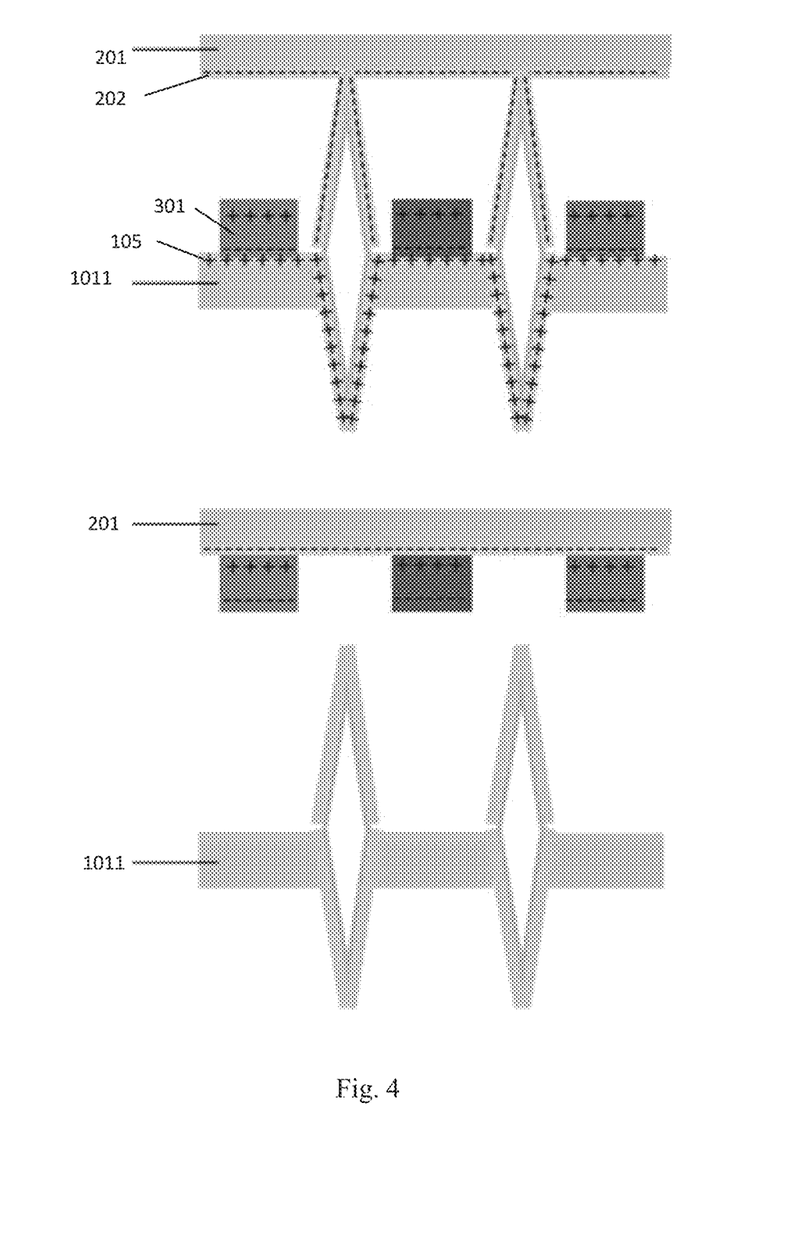
FIG. 4 shows the distribution of positive and negative charges during the chip transfer process.

In an embodiment, referring to FIG. 4, during the massive transfer of the Micro LEDs, the Micro LEDs on the chip transfer substrate need to be transferred to a receiving substrate 200. The receiving substrate 200 may be a display substrate. In this case, the Micro LEDs fabricated on the chip transfer substrate may be directly transferred to the display substrate, or the Micro LEDs may be indirectly transferred through the receiving substrate 200. The receiving substrate

200 may include a receiving base 201 and a receiving electrode 202 on the receiving base 201. In an embodiment, when the distance adjusting component of the chip transfer substrate is in the contraction state, the receiving electrode 202 may be in contact with the distance adjusting component. For example, when the distance adjusting component is in the contraction state, the receiving electrode 202 may be in electrical contact with the second electrode 1041 of the distance adjusting component described above and conduct charges to the receiving electrode 201 through the second electrode 1041. Since the polarities of the charges of the first electrode 1031 and the second electrode 1041 are opposite, the polarities of the charges conducted to the transfer electrode 105 and the receiving electrode 201 are also opposite. Meanwhile, since the charges at the lower side of the Micro LED to be transferred are excited by the transfer electrode 105, the polarity of the charges at the lower side of the Micro LED is opposite to the polarity of the charges of the transfer electrode 105, and the polarity of the charges at the upper side of the Micro LED is the same as the polarity of the charges of the transfer electrode 105, and thus, the polarity of the charges of at the upper side of the Micro LED to be transferred is opposite to the polarity of the charges of the receiving electrode 202. Therefore, the receiving substrate 200 can adsorb the Micro LED to be transferred (see the middle part in FIG. 4), thereby realizing the massive transfer of the Micro LEDs.

Referring to the lower part of FIG. 4, the chip transfer substrate can be reused because there is no residual charge on the chip transfer substrate due to the charge transfer of the first electrode 1031 and the second electrode 1041.

An embodiment of the present disclosure provides a chip transfer device, which includes the chip transfer substrate according to the above embodiments, and further includes a driving component 40 connected to the distance adjusting components 102 and configured to apply an external force to the distance adjusting components 102 to adjust the distance between the bases.

In an embodiment, the driving component 400 is configured to apply an external force in a vertical direction to the distance adjusting component 102 to enable the distance adjusting component 102 to be in an extending state in which a first distance is present between two adjacent bases 1011; and apply an external force in a horizontal direction to the distance adjusting component 102 to enable the distance adjusting component 102 to be in a contraction state in which a second distance is present between two adjacent bases 1011, the second distance being smaller than the first distance.

In an embodiment, the chip transfer device may further include the receiving substrate 200 described above.

The present disclosure also provides a chip transfer method using the chip transfer device, and the chip transfer device is the chip transfer device according to the embodiments of the disclosure.

In an embodiment, the chip transfer method includes applying an external force in a vertical direction to the distance adjusting component to enable the distance adjusting component to be in an extending state in which a first distance is present between two adjacent bases; depositing the Micro LEDs to be transferred on the bases; applying an external force in a horizontal direction to the distance adjusting component to enable the distance adjusting component to be in a contraction state in which a second distance is present between two adjacent bases, the second distance being smaller than the first distance; and transferring the Micro LEDs to a receiving substrate.

It should be noted that the driving component 400 may apply an external force to the chip transfer substrate to make the distance adjusting component in the extending state or the contraction state, so as to shorten the distance between adjacent bases, thereby shortening the distance between the Micro LEDs to be transferred. Therefore, the accuracy of the massive transfer of the Micro LEDs can be improved, and the high-accuracy massive transfer of the Micro LEDs can be implemented. Meanwhile, the driving component can apply the external force to the chip transfer substrate. Therefore mechanical energy can be converted into electric energy, and thus the Micro LEDs to be transferred can be fixed by means of electrostatic adsorption, and passive transfer of the Micro LEDs can be achieved.

It could be understood that the above embodiments are merely exemplary embodiments employed to illustrate the principle of the present disclosure, and the present disclosure is not limited thereto. It will be apparent to those skilled in the art that various changes and modifications can be made without departing from the spirit and scope of the present disclosure, and these changes and modifications are also considered to be within the protection scope of the present disclosure.

What is claimed is:

1. A chip transfer substrate, comprising:
 a substrate,
 a plurality of bases spaced apart from each other on the substrate, the plurality of bases being configured to carry micro light emitting diodes (Micro LEDs) to be transferred and being movable on the substrate; and
 a plurality of distance adjusting components each arranged between two adjacent bases of the plurality of bases and configured to adjust a distance between the two adjacent bases.

2. The chip transfer substrate of claim 1, wherein
 each of the plurality of distance adjusting components comprises a first electrification structure and a second electrification structure opposite to each other;
 between the two adjacent bases, one end of the first electrification structure is connected to one end of the second electrification structure and to one base, the other end of the first electrification structure is connected to the other end of the second electrification structure and to the other base, and
 the first and second electrification structures are deformed and brought into contact with each other by an external force, and surfaces of the first and second electrification structures facing each other generate charges of opposite polarities when brought into contact with each other.

3. The chip transfer substrate of claim 2, wherein
 the first electrification structure comprises a first electrode and a first thin film layer on a side of the first electrode close to the second electrification structure;
 the second electrification structure comprises a second electrode opposite to the first electrode and a second thin film layer on a side of the second electrode close to the first electrification structure; and
 the first thin film layer and the second thin film layer have different dielectric constants from each other.

4. The chip transfer substrate of claim 3, wherein
 a transfer electrode is on each of the plurality of bases; and
 the transfer electrode is electrically connected to the first electrode.

5. The chip transfer substrate of claim 4, wherein a material of the transfer electrode is the same as a material of the first electrode, and the transfer electrode and the first electrode are formed as a single piece.

6. The chip transfer substrate of claim 4, wherein a material of the transfer electrode comprises copper.

7. The chip transfer substrate of claim 3, wherein a material of the first thin film layer comprises polyimide; and a material of the second thin film layer comprises polyethylene terephthalate.

8. The chip transfer substrate of claim 1, wherein the plurality of bases are in one-to-one correspondence with the Micro-LEDs to be transferred.

9. The chip transfer substrate of claim 1, wherein the plurality of distance adjusting components each have a diamond shape or an oval shape when viewed in a side view.

10. The chip transfer substrate of claim 1, wherein the plurality of bases are arranged in a matrix when viewed in a plan view.

11. A chip transfer device, comprising the chip transfer substrate according to claim 1.

12. The chip transfer device of claim 11, further comprising a driving component connected to each of the distance adjusting components and configured to apply an external force to the distance adjusting component to adjust the distance between the two adjacent bases.

13. The chip transfer device of claim 12, wherein the driving component is configured to:
apply an external force in a vertical direction to the distance adjusting component to enable the distance adjusting component to be in an extending state in which a first distance is present between the two adjacent bases; and
apply an external force in a horizontal direction to the distance adjusting component to enable the distance adjusting component to be in a contraction state in which a second distance is present between the two adjacent bases, the second distance being smaller than the first distance.

14. The chip transfer device of claim 11, wherein the chip transfer device further comprises a receiving substrate comprising a receiving base and a receiving electrode on a side of the receiving base close to the chip transfer substrate.

15. The chip transfer device of claim 13, further comprising a receiving substrate comprising a receiving base and a receiving electrode on a side of the receiving base close to the chip transfer substrate,
wherein the receiving electrode is configured to contact the distance adjusting component in response to the distance adjusting component being in the contraction state.

16. A chip transfer method using a chip transfer device, wherein the chip transfer device is the chip transfer device of claim 11.

17. The chip transfer method of claim 16, comprising:
applying a first external force in a vertical direction to the distance adjusting component to enable the distance adjusting component to be in an extending state in which a first distance is present between the two adjacent bases;
depositing the Micro LEDs to be transferred on the bases;
applying a second external force in a horizontal direction to the distance adjusting component to enable the distance adjusting component to be in a contraction state in which a second distance is present between the two adjacent bases, the second distance being smaller than the first distance; and
transferring the Micro LEDs to a receiving substrate.

\* \* \* \* \*